March 2, 1965 J. R. WILKINSON 3,171,972
CLOCKING OF LOGIC CIRCUITS
Filed May 12, 1960
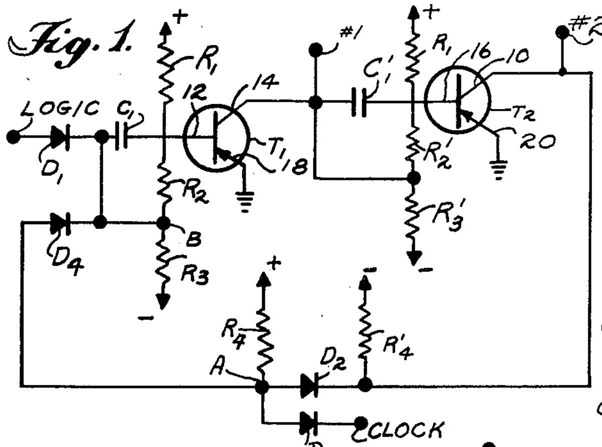
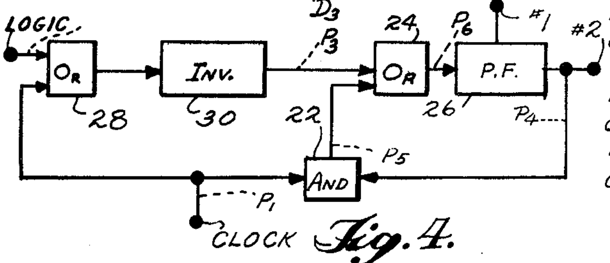
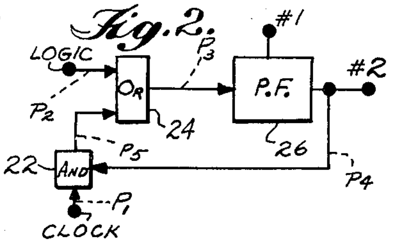
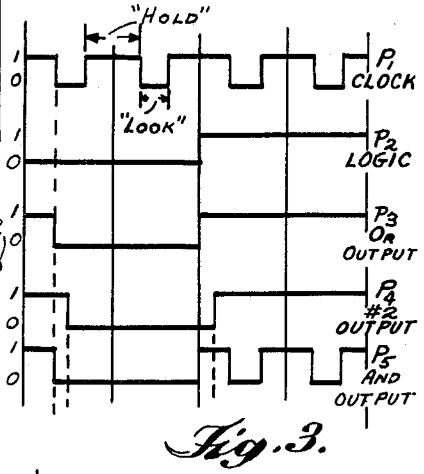
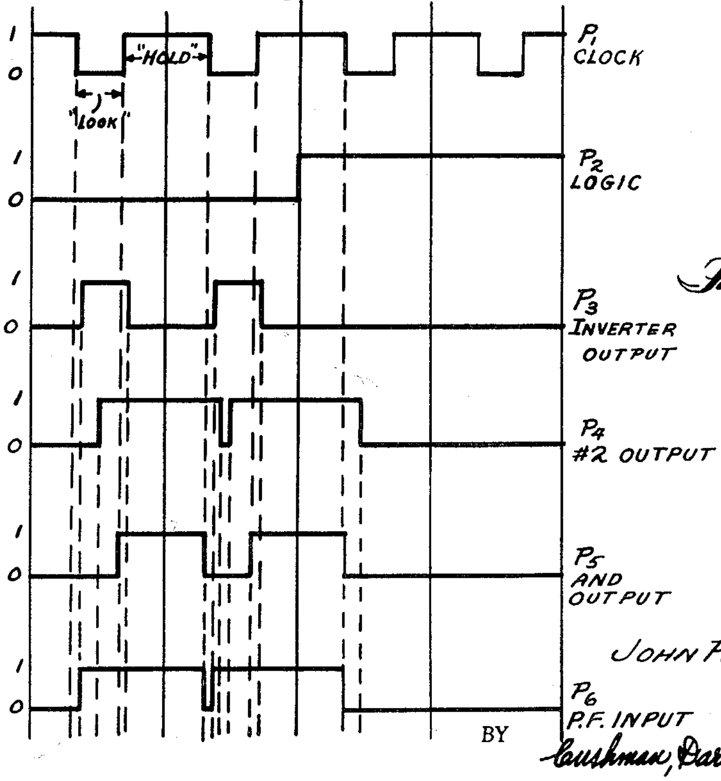
Fig. 5
INVENTOR
JOHN R. WILKINSON
BY Cushman, Darby & Cushman
ATTORNEYS United States Patent Office 3,171,972
Patented Mar. 2, 1965

3,171,972
CLOCKING OF LOGIC CIRCUITS

John R. Wilkinson, Allendale, N.J., assignor to Sperry Rand Corporation, New York, N.Y., a corporation of Delaware Filed May 12, 1960, Ser. No. 28,796
7 Claims. (Cl. 307—88.5)

This invention relates to clocking of logic circuits and more particularly to clocking of a regenerative bistable logic circuit.

Logic circuits operating on a binary number system, employ elements which are capable of being switched from one state to another. Transistors are readily employed as such elements since application of proper potentials to a transistor will cause it to turn on or turn off, thereby switching its state. Two transistors can be arranged in tandem with a feedback path to form a regenerative bistable circuit capable of being switched in state on a proper combination and application of binary signals. This invention employs a regenerative bistable logic circuit, such as the transistor type just referred to though no limitation thereto is intended, together with circuit means for controlling the resultant state of the circuit in accordance with the binary senses of both a binary input signal and a binary control or clock pulse signal.

It is therefore an object of this invention to provide a bistable logical circuit, which includes a feedback path under the control of a binary control signal, with means for causing the final state of the circuit to be dependent on the sense of the binary input signal only when the binary control signal is in a predetermined one but not the other of its senses regardless of the initial state of the logical circuit.

Another object of the invention is to provide a transistorized regenerative circuit as in the foregoing object, whose state can be switched only when the clock pulse is in that predetermined one of its senses.

Still other objects of this invention will become apparent to those of ordinary skill in the art by reference to the following detailed description of the exemplary embodiments of the apparatus and the appended claims. The various features of the exemplary embodiments according to the invention may be best understood with reference to the accompanying drawings, wherein:

FIGURE 1 is a schematic diagram of a regenerative bistable logic circuit,

FIGURE 2 is a block diagram of the circuit of FIGURE 1,

FIGURE 3 shows idealized signal waveforms for various points in FIGURE 2,

FIGURE 4 is a block diagram of an improved regenerative bistable logic circuit and its associated logic control elements, and FIGURE 5 illustrates signal waveforms related to the circuitry of FIGURE 4.

In FIGURE 1 a bistable circuit is formed by transistors $T_1$, $T_2$ and a feedback path which runs from collector 10 of transistor $T_2$ through diodes $D_2$, $D_4$ and resistor $R_2$ back to the base 12 of transistor $T_1$. The voltage divider comprising resistors $R_1$, $R_2$, and $R_3$ connected between positive and negative voltage sources provides bias for the base 12 of transistor $T_1$. The voltage divider $R_1'$, $R_2'$, and $R_3'$ is identical to the divider $R_1$, $R_2$, $R_3$ and is connected between positive and negative voltage sources to provide similar bias for collector 14 of transistor $T_1$ and base 16 of transistor $T_2$. Bias for collecter 10 of transistor $T_2$ is provided via resistor $R_4'$ which is connected to a negative voltage source. The emitters 18 and 20 of transistors $T_1$ and $T_2$ are both coupled to ground. Junction A between diodes $D_2$ and $D_4$ is biased by resistor $R_4$ connected to a positive voltage source. Transistors $T_1$ and $T_2$ are additionally provided with input coupling capacitors $C_1$ and $C_1'$ connected to the junction between $R_1$, $R_2$, and $R_1'$, $R_2'$, respectively.

A binary or logic input signal applied through diode $D_1$ is A.C. coupled to transistor base 12 by condenser $C_1$ and D.C. coupled thereto via junction B and resistor $R_2$. Similarly, the output from collector 14 is A.C. coupled to base 16 by condenser $C_1'$ and D.C. coupled thereto through resistor $R_2'$. A binary control signal in the form of a clock pulse may be applied to the circuit through diode $D_3$ to junction A. A mid-output may be taken from the collector 14 of transistor $T_1$ as at terminal No. 1, while the normal or end output can be taken from the collector 10 of transistor $T_2$ via output terminal No. 2.

The section of the circuit comprising transistors $T_1$, $T_2$ and their related bias and coupling means form a pulse-former which is made bistable in nature by the feedback path from its output to its input, the feedback path being under the control of the clock signal. The state of the bistable circuit of FIGURE 2 may be denoted by the binary numbers 0 and 1 in an arbitrarily selected manner. In the following discussion, a 0 refers to a pulse or voltage condition more negative than a 1 pulse or voltage condition. The bistable circuit may therefore be said to be in a 1 state when the normal output No. 2 is relatively positive (in this instance ground), and in a 0 state when that output is negative. The mid-output No. 1 is the complement of output No. 2.

In the following exemplary discussion, the resistors $R_1$ and $R_1'$ have a value of 27,000 ohms, the resistors $R_2$, $R_2'$ have a value of 1,500 ohms, the resistors $R_3$, $R_3'$, $R_4$, $R_4'$ have a value of 8,200 ohms, the coupling capacitors $C_1$, $C_1'$ have a value of 100 micromicrofarads, and the voltage sources are plus 12 volts and minus 15 volts.

In FIGURE 1, a negative input or binary 0 to the base 12 of transistor $T_1$ causes it to conduct, placing its collector at ground and producing a 1 output. This results in base 16 going positive, turning off transistor $T_2$ and placing output No. 2 at a negative potential to effect a 0 state for the bistate circuit as a whole. The voltage divider consisting of the resistor $R_4$, $R_4'$ and diode $D_2$ between the plus 12 and minus 15 volt sources places junction A at approximately minus 3 volts. If the control signal or clock is relatively positive effecting a binary 1 during what may be termed a clock "hold" period, diode $D_3$ is cut off, junction B remains negative assuming the logic input through diode $D_1$ is 0, and transistor $T_1$ keeps conducting to maintain the 0 condition. When the clock voltage goes negative then to represent a binary 0 during which time the clock may be said to be in a "look" period, the 0 condition is still maintained.

On the other hand a relatively positive input or binary 1 to the base 12 cuts off transistor $T_1$ and turns on transistor $T_2$, placing output No. 2 at a 1 condition. This, if the clock voltage is relatively positive, puts junction A at ground through the feedback path from the collector 10 to the voltage divider, so junction B is at ground through diode $D_4$, and output No. 2 stays in the 1 condition while the clock is positive during the "hold" period. When the clock "looks," however, junction A goes negative, diode $D_4$ clamps junction B at the clock negative voltage assuming the logic input through diode $D_1$ is then 0, turning on transistor $T_1$ and thereby making output No. 2 go negative, i.e. to a 0 condition.

Therefore, unless the logic input is 1, the clock always changes the No. 2 output to a 0 condition by deactivating the feedback loop during the "look" time. The complete operation of FIGURE 1 will be described with reference to the block diagram of FIGURE 2 and the voltage waveforms shown in FIGURE 3. The elements $D_2$, $D_3$, and $R_4$ of FIGURE 1 form an And circuit, while elements $D_1$, $D_4$, and $R_3$ form an Or circuit. FIGURE 2 represents the circuit of FIGURE 1 using a block diagram form for the And circuit 22, Or circuit 24, and pulseformer circuit 26 for ease of discussion as to the circuit operation. The pulseformer has some slight inherent delay in changing its output condition upon receipt of change in its input signal, and this delay is shown in the $P_4$ waveform of FIGURE 3.

From FIGURES 2 and 3, it will be seen that if the pulseformer output $P_4$ initially is a 1 during the "hold" time or 1 condition of the clock control signal $P_1$, then the And input $P_5$ to the Or circuit will be 1, therefore, regardless of the sense of the logic input signal $P_2$ during that "hold" time the input $P_3$ to the pulseformer from the Or circuit will be 1 and the pulseformer will be maintained in the 1 state at least until the next clock "look" time. At that time, the control signal $P_1$ is 0 so the And input $P_5$ to the Or circuit is 0. Consequently, the input $P_3$ to the pulseformer at that time depends upon the sense of the logic signal $P_2$ to the Or circuit. That is, the pulseformer input $P_3$ will then be 0 when the logic input is 0, or will be 1 when the logic input is 1. Therefore, the resultant state of the pulseformer follows or is non-complementary to the logic input during the clock "look" time.

When output $P_4$ is initially 0 during the "hold" time of the clock $P_1$, the And input $P_5$ to the Or circuit will be 0, and again, the pulseformer input $P_3$ will depend upon the sense of the logic input $P_2$ to the Or circuit. Similarly, when the initial output $P_4$ is 0 and the clock $P_1$ "looks" the And input $P_5$ to the Or circuit will remain 0 and the pulseformer input $P_3$ will still depend upon the sense of the logic input $P_2$ to the Or circuit. The results of the circuit analysis for the above combinations of conditions are summarized in Table I:

*Table I*

| Initial Output $P_4$ | Clock $P_1$ | Logic $P_2$ | Resultant Output $P_4$ |
|---|---|---|---|
| 1 | 1 | 1 or 0 | 1 |
| | 0 | 1 | 1 |
| | 0 | 0 | 0 |
| 0 | 1 | 0 | 0 |
| | 1 | 1 | 1 |
| | 0 | 0 | 0 |
| | 0 | 1 | 1 |

The above summary corresponds to the waveforms shown in FIGURE 3 and indicates the result of the final output in accordance with the senses of the binary logic and control signals. As shown in the summary, the circuit of FIGURE 2 invariably maintains the pulseformer output $P_4$ in its initial 1 condition during the clock "hold" (1) time regardless of the sense of the logic input, and causes the resultant $P_4$ output during the following "look" time (0) to be non-complementary to the logic input $P_2$. When output $P_4$ is initially 0, a similar situation exists during the "look" time in that the $P_4$ resultant output depends on the reuse of the $P_2$ logic signal. As distinguished from when the $P_4$ output is initially 1, however, an initial $P_4$ output of 0 is not invariably maintained during the "hold" time regardless of the sense of the logic signal since as the above table shows the resultant output then is dependent on whether the logic signal is a 0 or 1.

This last situation is not desirable as the bistable circuit will be switched from 0 to 1 state for a logic input of 1 during the clock "hold" time. It is preferable to maintain the bistable circuit in its state during the clock "hold" time and only allow it to be set to 1 or cleared to 0 during the clock "look" time. This can be accomplished by a circuit as represented in the block diagram of FIGURE 4, which is the same as that shown in FIGURE 2 with the addition of a second Or circuit 28 followed by an inverter 30. In FIGURE 4, the logic signal $P_2$ is coupled as an input to the added Or circuit 28 with the output of the inverter replacing the $P_2$ signal input to Or circuit 24. The new Or circuit 28 also receives the $P_1$ clock signal. The inverter may be like either of the transistor stages of the pulseformer of FIGURE 1 without a feedback path. As will become fully apparent in the following description of the operation of FIGURE 4 during which reference is made to the voltage waveforms shown in FIGURE 5, the Or and inverter circuits 28, 30 together operate as a true Or-Inverter or Or-Not logical circuit.

Assume the pulseformer output $P_4$ to be 1 during the clock "hold" time. Therefore, the output $P_5$ from And circuit 22 will be 1, the output $P_6$ from Or circuit 24 will be 1 and the pulseformer will be maintained in the 1 state during this clock "hold" time. The output $P_3$ from the inverter will be 0 if either of the inputs $P_1$ and $P_2$ to Or circuit 28 are 1. $P_3$ will only be 1 if both of the inputs $P_1$ and $P_2$ are 0. When the clock "looks," the And output $P_5$ will go to 0, therefore the Or output $P_6$ will depend on the inverter output $P_3$. When the logic input $P_2$ is 1, the inverter output will be 0, and since both of the inputs to Or circuit 24 are then 0, $P_6$ will be 0, setting the pulseformer to 0. When the logic input $P_2$ is 0, the inverter output will be 1, the output $P_6$ will then be 1, and the pulseformer will be maintained at 1. However, it will be noted that due to the inherent delay in the inverter and in the pulseformer, the And output $P_5$ will go to 0 slightly before the inverter output $P_3$ reaches 1. The pulseformer will therefore clear to 0 during the "look" time. The period for which it stays at 0 will be equal to the time of the delay in the inverter, since as soon as the inverter output $P_3$ reaches 1, the pulseformer will be set back to 1. This flip to 0 by the pulseformer has such a short time duration that its effect in the output $P_4$ can be eliminated by ordinary circuit means and presents no problem or limitation on the use of the circuitry of FIGURE 4. It can be stated, therefore, that the pulseformer is effectively set to 1 during the clock "look" time for a logic input of 0.

Assume now that the pulseformer is in its 0 state. During the clock "hold" time, the And output $P_5$ will be 0, and since the inverter output $P_3$ is also 0 regardless of the sense of the logic input, the Or output $P_6$ will be 0, maintaining the pulseformer in its 0 state. When the clock "looks," the And output $P_5$ remains 0, but the inverter output $P_3$ depends upon the logic input $P_2$. When $P_2$ is 0, the inverter output is 1, therefore $P_6$ is 1, setting the pulseformer to the 1 state. When $P_2$ is 1, the inverter output is 0, and the Or output $P_6$ is 0, maintaining the initial 0 state. The results of the circuit analysis for the preceding combinations of conditions are summarized in the following table:

*Table II*

| Initial Output $P_4$ | Clock $P_1$ | Logic $P_2$ | Resultant Output $P_4$ |
|---|---|---|---|
| 1 | 1 | 1 or 0 | 1 |
| | 0 | 1 | 0 |
| | 0 | 0 | 1 |
| 0 | 1 | 1 or 0 | 0 |
| | 0 | 1 | 0 |
| | 0 | 0 | 1 |

The above summary corresponds to the waveforms shown in FIGURE 5, overlooking the momentary flip of the pulseformer, and shows the results of the final output in accordance with the senses of the binary logic and control signals. As indicated by the summary, the circuit of FIGURE 4 maintains its initial output state during the clock "hold" time, regardless of the sense of the logic input, and changes its state only during the clock "look" time and then only when the sense of the logic input is non-complementary to the sense of the initial output. The resultant $P_4$ output during the "look"

times is consequently the complement of the $P_2$ logic signal, but if the non-complement thereof is desired that can be obtained from the No. 1 or mid-output terminal of the pulseformer.

A bistable logical circuit has been provided, therefore, in which the final state of the circuit is dependent on the sense of the binary input signal only when the binary control signal is in a predetermined one ("look") but not the other ("hold") of its senses, regardless of the initial state of the logical circuit.

This invention can be used with either single phase or multi-phase clocking systems. In multi-phase systems, the "look" portions of successive phases must not overlap. In single phase systems, there must be a sufficient delay between successive clocked stages so that the input to a clocked stage does not change during the "look" time due to a change in the input of the previous clocked stage. This invention uses fewer components than were previously required and causes less circuit delay, allowing higher operational speeds. Also, only one polarity of clock pulse is necessary. The output of the clocked Or-inverter can be used as the input to a number of bistable circuits if desired.

Thus, it is apparent that this invention successfully achieves the various objects and advantages herein set forth.

Modifications of this invention not described herein will become apparent to those of ordinary skill in the art after reading this disclosure. Therefore, it is intended that the matter contained in the foregoing description and the accompanying drawings be interpreted as illustrative and not limitative, the scope of the invention being defined in the appended claims.

What is claimed is:

1. In an arrangement for indicating the sense of a binary input signal and including a bistable circuit whose output is returned to an input of said circuit in accordance with the sense of a binary control signal, the improvement comprising means including means coupled to said input and performing an Or-Not function, coupled to receive both of said binary signals for controlling the final state of said circuit in accordance with the instant binary sense of the input signal regardless of the initial state of said circuit but only when said control signal is in a predetermined one of its senses.

2. An arrangement as in claim 1 wherein the Not function is performed by a binary signal inverter coupled at its output to the said input of said bistable circuit.

3. Apparatus for indicating the sense of a binary input signal comprising a bistable circuit having a feedback path for coupling an output of said circuit to an input thereof means in said path for controlling the feedback in accordance with a binary control signal, and further means including an Or-Not circuit coupled to receive said input and control signals and applying its output to the said input of said bistable circuit for controlling the final state of said circuit in accordance with the instant binary sense of said output signal regardless of the initial state of said circuit but only when said control signal is in a predetermined one of its senses.

4. Apparatus as in claim 3 wherein said further means includes means to Or the said input and control signals and means coupled to said input for changing the binary sense of the Or means output.

5. Apparatus as in claim 4 wherein the sense changing means is an inverter.

6. Apparatus for indicating the sense of a binary input signal comprising an Or-Inverter circuit coupled to receive the said binary signal, an Or circuit coupled to the Or-Inverter circuit output, a bistable circuit coupled at an input to the output of said Or circuit, the output of the bistable circuit furthest from its said input being returned to that input through a feedback path including first an And gate and then said Or circuit, and a binary control signal coupled as an input to both the And gate and the Or-Inverter circuit, whereby the bistable circuit can only change its state according to a logical combination of said binary input and control signals when the control signal is in a predetermined one of its senses and will maintain its state when the control signal is in its other sense regardless of the sense of the input signal.

7. Apparatus for controlling the switching of a bistable circuit in accordance with the binary sense of a control signal comprising: first and second switching elements having an output electrode and a control electrode means connecting the output electrode of said first switching element to the control electrode of said second switching element; and means including gating means responsive to a control signal connecting the output electrode of said second switching element to the control electrode of said first switching element, such that the binary state of said bistable circuit can be switched only when said control signal is of a predetermined binary sense.

References Cited in the file of this patent

UNITED STATES PATENTS

| | | |
|---|---|---|
| 2,827,566 | Lubkin | Mar. 18, 1958 |
| 2,898,479 | McElroy | Aug. 4, 1959 |
| 2,909,678 | Jensen | Oct. 20, 1959 |
| 2,918,586 | Curtis | Dec. 22, 1959 |

OTHER REFERENCES

Pulse and Digital Circuits, Millman and Taub, TK 7835 M55, pages 409–411.